US012751240B2

(12) United States Patent
Hao et al.

(10) Patent No.: US 12,751,240 B2
(45) Date of Patent: Sep. 29, 2026

(54) MULTI-TARGET DESIGN FOR IN-SITU ANALYSIS OF SEMICONDUCTOR FABRICATION PROCESS

(71) Applicant: Applied Materials, Inc., Santa Clara, CA (US)

(72) Inventors: Yudong Hao, Fremont, CA (US); Todd J. Egan, Fremont, CA (US)

(73) Assignee: Applied Materials, Santa Clara, CA (US)

( * ) Notice: Subject to any disclaimer, the term of this patent is extended or adjusted under 35 U.S.C. 154(b) by 472 days.

(21) Appl. No.: 18/203,353

(22) Filed: May 30, 2023

(65) Prior Publication Data

US 2024/0404851 A1 Dec. 5, 2024

(51) Int. Cl.
*H10P 72/00* (2026.01)
*G01B 11/00* (2006.01)
*G05B 19/418* (2006.01)

(52) U.S. Cl.
CPC .......... *H10P 72/0612* (2026.01); *G01B 11/00* (2013.01); *G05B 19/41875* (2013.01); *G01B 2210/56* (2013.01); *G05B 2219/32368* (2013.01)

(58) Field of Classification Search
CPC ................ G01B 11/00; G01B 2210/56; G05B 19/41875; G05B 2219/32368; H01L 21/67276
See application file for complete search history.

(56) References Cited

U.S. PATENT DOCUMENTS 5,347,460 A * 9/1994 Gifford ............. H01L 21/67253 700/121
6,812,077 B1 11/2004 Chan et al.
2002/0154302 A1* 10/2002 Rosencwaig ...... G01B 11/0641 356/369
2004/0246476 A1 12/2004 Bevis et al.
2005/0032250 A1* 2/2005 Mui ........................ H01L 22/20 257/E21.232

(Continued)

FOREIGN PATENT DOCUMENTS

KR 20070058374 A 6/2007
TW 202111310 A 3/2021

OTHER PUBLICATIONS

U.S. Appl. No. 18/396,226 , Non-Final Office Action, Mailed On Dec. 29, 2025, 19 pages.

(Continued)

*Primary Examiner* — Kidest Worku
(74) *Attorney, Agent, or Firm* — Kilpatrick Townsend & Stockton LLP

(57) ABSTRACT

A system can provide in-situ analysis of at least some of a plurality of targets simultaneously during a fabrication process. The system can include a semiconductor processing tool having a chamber. The system can also include a sample arranged within the chamber, the sample having the plurality of targets with different feature orientations and/or feature geometries. The semiconductor processing tool can be configured to perform the fabrication process on the sample. Additionally, the system can include a metrology tool integrated with the semiconductor processing tool. The metrology tool can provide the in-situ analysis of at least some of the plurality of targets simultaneously during the fabrication process.

20 Claims, 9 Drawing Sheets

(56) References Cited

U.S. PATENT DOCUMENTS

| | | | | |
|---|---|---|---|---|
| 2007/0020890 | A1* | 1/2007 | Thakur | H10P 72/0461 118/719 |
| 2008/0059141 | A1 | 3/2008 | Finarov et al. | |
| 2009/0059240 | A1 | 3/2009 | Hartig et al. | |
| 2012/0203369 | A1* | 8/2012 | Behm | G05B 19/41875 700/108 |
| 2013/0039460 | A1* | 2/2013 | Levy | G01N 21/27 356/612 |
| 2016/0033398 | A1* | 2/2016 | Kim | G03F 7/70683 356/243.1 |
| 2018/0108578 | A1 | 4/2018 | Pandev et al. | |
| 2018/0112968 | A1* | 4/2018 | Chen | G01B 11/02 |
| 2020/0073255 | A1 | 3/2020 | Montilla et al. | |
| 2020/0124978 | A1* | 4/2020 | Chen | G03F 7/70958 |
| 2021/0005436 | A1 | 1/2021 | Vaez-iravani et al. | |

OTHER PUBLICATIONS

Office Action for Application No. TW113119024, Mailed On Sep. 10, 2025, 13 pages.

U.S. Appl. No. 18/396,226 , Notice of Allowance, Mailed On Apr. 15, 2026, 11 pages.

* cited by examiner

MULTI-TARGET DESIGN FOR IN-SITU ANALYSIS OF SEMICONDUCTOR FABRICATION PROCESS

TECHNICAL FIELD

The present disclosure relates generally to semiconductor fabrication, and more particularly (although not necessarily exclusively), to using multiple targets on a sample for in-situ analysis of semiconductor fabrication processes.

BACKGROUND

Recent advances in performance optimization of semiconductor materials have driven the need to combine multiple, diverse process steps into a single vacuum mainframe (e.g. deposit, etch, implant and anneal without breaking vacuum) or into a single chamber. This in-vacuum, in-chamber integration of different process steps onto a single vacuum mainframe or chamber avoids variable, deleterious effects of atmospheric contamination on very thin, chemically active films and interfaces.

Emerging deployment of in-vacuum and in-chamber process integration also creates new challenges for semiconductor device metrology. Measurements which are typically performed at atmosphere in dedicated, standalone metrology tools must now be performed in situ or in the vacuum mainframe of a process tool where engineering and space constraints limit options to enhance measurement sensitivity through movement of the metrology optics or the device under test.

SUMMARY

Some embodiments propose a method and apparatus to extract enhanced optical and process control information from interrogation of multiple optical targets with different geometries and orientations without moving either the device structure or the optics. Certain aspects and examples of the present disclosure relate to using samples having a plurality of targets to enable simultaneous in-situ analysis of the different targets during a fabrication process. Spectroscopic emissions from the different targets can provide different signals to enhance sensitivity to the fabrication process. In accordance with a particular embodiment, for example, a system includes a semiconductor processing tool: a sample arranged within a chamber of the semiconductor processing tool, the sample having a plurality of targets with multiple different feature orientations and/or feature geometries designed to reveal performance characteristic of a fabrication process, the semiconductor processing tool configured to perform the fabrication process on the sample: and a metrology tool integrated with the semiconductor processing tool, wherein the metrology tool is configured to provide in-situ analysis of at least some of the plurality of targets simultaneously during the fabrication process.

In an embodiment, the fabrication process comprises an etch process or a deposition process.

In another embodiment, the multiple different feature orientations of the plurality of targets include line structures having different orientations: and the metrology tool comprises: a light source: an optical system configured to control polarization of a beam of light from the light source that impinges on the sample, wherein the plurality of targets with the multiple difference feature orientations provide spectroscopic emissions when illuminated with the beam of light from the light source: a detector configured to simultaneously measure the spectroscopic emissions from the plurality of targets: one or more processors: and a memory that includes instructions executable by the one or more processors for causing the one or more processors to: associate portions of the spectroscopic emissions with corresponding ones of the plurality of targets: and derive at least one result regarding the fabrication process based on at least one of the portions of the spectroscopic emissions. In an embodiment, the optical system may include a polarizer having a fixed orientation, and the polarizer is arranged in-line with the beam of light from the light source, and wherein the beam of light is substantially normal to surfaces of the plurality of targets, and the plurality of targets provide the spectroscopic emissions when illuminated with the beam of light. In another embodiment, the beam of light is off-axis to surfaces of the plurality of targets. The system may include instructions executable by the one or more processors for causing the one or more processors to adjust at least one process parameter of the fabrication process based at least in part on the at least one result.

In another embodiment, at least one of the multiple different feature orientations is configured to provide spectroscopic emissions that include transverse electric (TE) polarization and at least one of the multiple different feature orientations is configured to provide spectroscopic emissions that include transverse magnetic (TM) polarization.

In another embodiment, the plurality of targets comprise pairs of targets with equivalent geometries, a first member of each pair having a line structure orientation orthogonal to a line structure orientation of a second member of each pair.

In another embodiment, the at least one result comprises a change in width, depth, sidewall angle, or pitch associated with at least one of the line structures.

In another embodiment, the system also includes instructions executable by the one or more processors for causing the one or more processors to adjust at least one process parameter of the fabrication process based at least in part on the at least one result.

In yet another embodiment, the multiple different feature geometries of the plurality of targets include lines and spaces where at least some of the lines and/or spaces have different widths; and the metrology tool comprises: an imaging device configured to obtain spectroscopic images of the plurality of targets during the fabrication process; one or more processors; and a memory that includes instructions executable by the one or more processors for causing the one or more processors to: associate portions of the spectroscopic images with corresponding ones of the plurality of targets; and derive at least one result regarding the fabrication process based on at least one of the portions of the spectroscopic images. The at least one result may comprise a width, depth, sidewall angle, or pitch associated with at least one of the lines and/or spaces. The system may also include instructions executable by the one or more processors for causing the one or more processors to train a machine-learning model to identify a critical dimension result in a future fabrication process using the at least one result. The system may also include instructions executable by the one or more processors for causing the one or more processors to adjust at least one process parameter of the fabrication process based at least in part on the at least one result. In some embodiments, the at least one process parameter may comprise pressure, flow, or a radio frequency of an electromagnetic field used during the fabrication process.

In accordance with another embodiment, a method includes arranging a sample within a chamber of a semiconductor processing tool, the sample having a plurality of targets with multiple different feature orientations and/or feature geometries: performing a fabrication process on the sample; and providing, by a metrology tool integrated with the semiconductor processing tool, in-situ analysis of at least some of the plurality of targets simultaneously during the fabrication process.

In an embodiment, the multiple different feature orientations of the plurality of targets include line structures having different orientations, the method further comprising: illuminating the sample with a beam of light from a light source of the metrology tool; measuring spectroscopic emissions from the plurality of targets; associating portions of the spectroscopic emissions with corresponding ones of the plurality of targets; and deriving at least one result regarding the fabrication process based on at least one of the portions of the spectroscopic emissions.

A further understanding of the nature and advantages of the present invention may be realized by reference to the following portions of the specification and attached drawings.

DETAILED DESCRIPTION

Figure 1A:
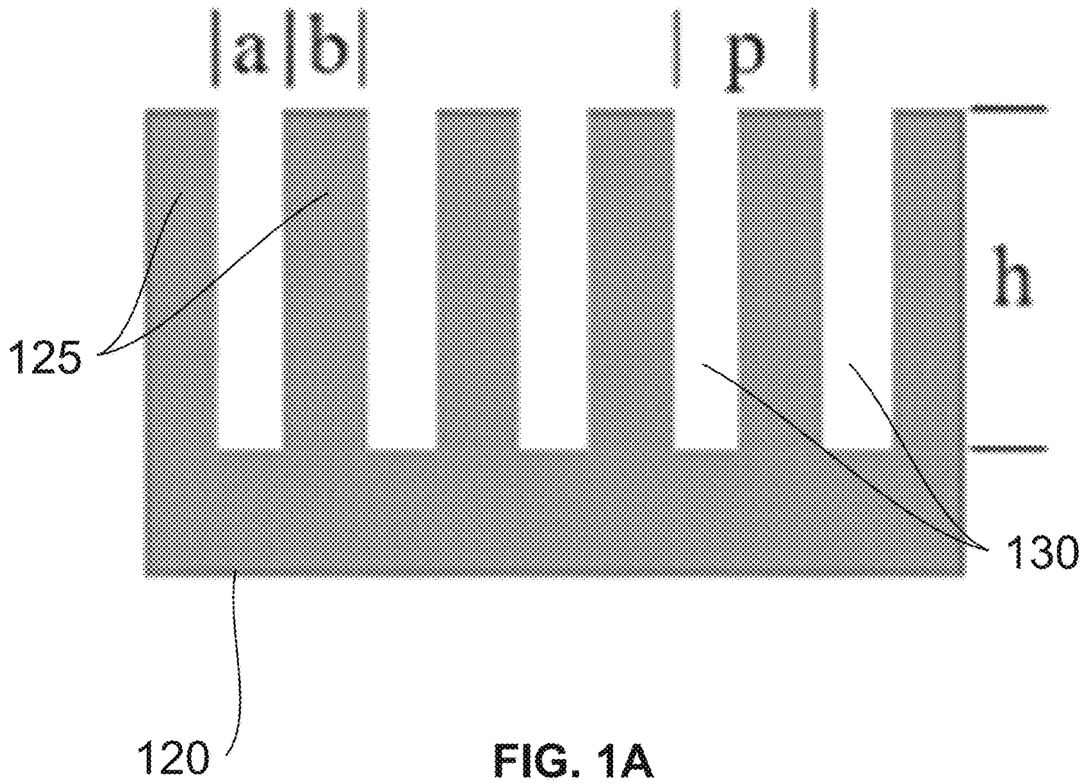
FIG. 1A is a schematic of a cross sectional view of a sample having a plurality of line structures according to one example of the present application.

Certain aspects and examples of the present disclosure relate to using samples having a plurality of targets to enable simultaneous in-situ analysis during a fabrication process. The plurality of targets can include multiple different feature orientations and/or feature geometries. The samples can be placed in a semiconductor processing tool and exposed to a fabrication process. A metrology tool integrated with the semiconductor processing tool can provide simultaneous in-situ analysis of at least some of the plurality of targets during the fabrication process. At least one result regarding the fabrication process can be derived based on the in-situ analysis. In some examples, the fabrication process can be an etch process, a deposition process, or some combination of etch and deposition processes.

The samples having a plurality of targets can enable simultaneous in-situ analysis of the plurality of targets to derive on-tool conclusions about the fabrication process performance. Similar on-tool conclusions may not be derived from fabrication environments that do not include the samples with the plurality of targets. For example, a fabrication environment that includes a sample with a single target may not have sufficient content to derive the on-tool conclusions about the fabrication process performance. As another example, multiple targets that only enable ex-situ analysis may fail to derive the on-tool conclusions due to a lack of immediate, in-situ data that reveals an evolution of a geometry of the targets driven by the fabrication process over time.

In some examples, the multiple different feature orientations of the plurality of targets can include line structures having different orientations. The metrology tool (e.g., a reflectometer or ellipsometer) can include at least one source of electromagnetic radiation (referred to herein as a light source), an optical system configured to control polarization of a beam of light from the light source, and at least one detector. The plurality of targets with line structures have different orientations that can provide spectroscopic emissions when illuminated with the beam of light from the light source. The optical system may include a polarizer having a fixed orientation and the polarizer may be arranged in-line with the beam of light from the light source. The detector can be configured to simultaneously measure the spectroscopic emissions from the plurality of targets. In some examples, a computing device that includes one or more processors can associate portions of the spectroscopic emissions with corresponding ones of the plurality of targets. The computing device may be part of the semiconductor processing tool, part of the metrology tool, or part of a separate computing system. The one or more processors can derive at least one result regarding the fabrication process based on at least one of the portions of the spectroscopic emissions. For example, the at least one result can include a change in dimension of at least one of the line structures in response to an etching process. The change in dimension can include a change in width, depth, sidewall angle, or pitch of at least one of the line structures. In some examples, the one or more processors can adjust at least one parameter of the fabrication process based at least in part on the at least one result.

The beam of light can be substantially normal to surfaces of the plurality of targets in some embodiments (e.g., reflectometry) and at an angle in other embodiments (e.g., ellipsometry). In some examples, the plurality of targets can include pairs of targets having equivalent geometries. A first member of each pair can have a line structure orientation orthogonal to a line structure orientation of a second member of each pair. For example, the first member of one of the pairs can provide spectroscopic emissions that provide transverse electric (TE) polarization and the second member of one of the pairs can provide spectroscopic emissions that provide transverse magnetic (TM) polarization.

In some examples, the one or more processors can train a machine-learning model to identify a critical dimension result in a future fabrication process using the at least one result. The one or more processors can adjust at least one parameter of the fabrication process based at least in part on the at least one result. The at least one parameter of the fabrication process can include pressure, flow, or a radio frequency of an electromagnetic field used during the fabrication process.

Figure 1B:
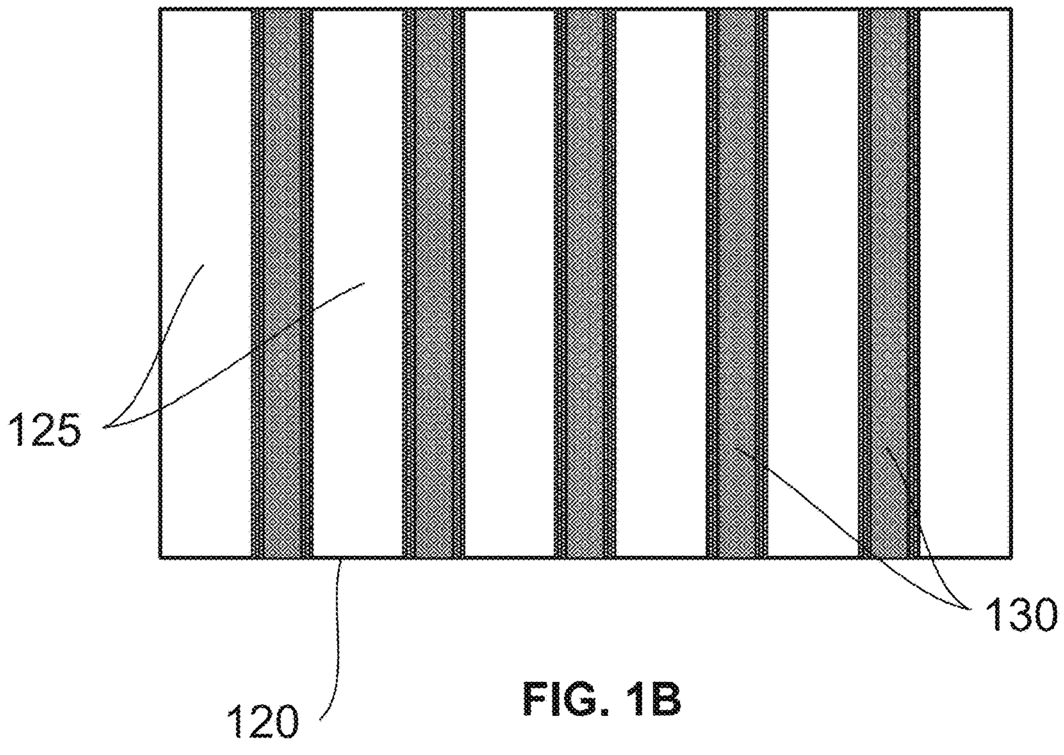
FIG. 1B is a plan view of the sample showing the line structures separated by spaces.

FIG. 1A is a schematic of a cross sectional view of a sample 120 having a plurality of line structures 125 according to one example of the present application. FIG. 1B is a plan view of the sample 120 showing the line structures 125 separated by spaces 130. The line structures 125 of the sample 120 can have parameters that include depth (h), width (b), separation width or space width (a), and line/space pitch (p). Control of the line/space geometry can be important to performance of many semiconductor devices. Thus, understanding how the parameters can be altered by etching or other semiconductor processes can be helpful.

Figure 2:
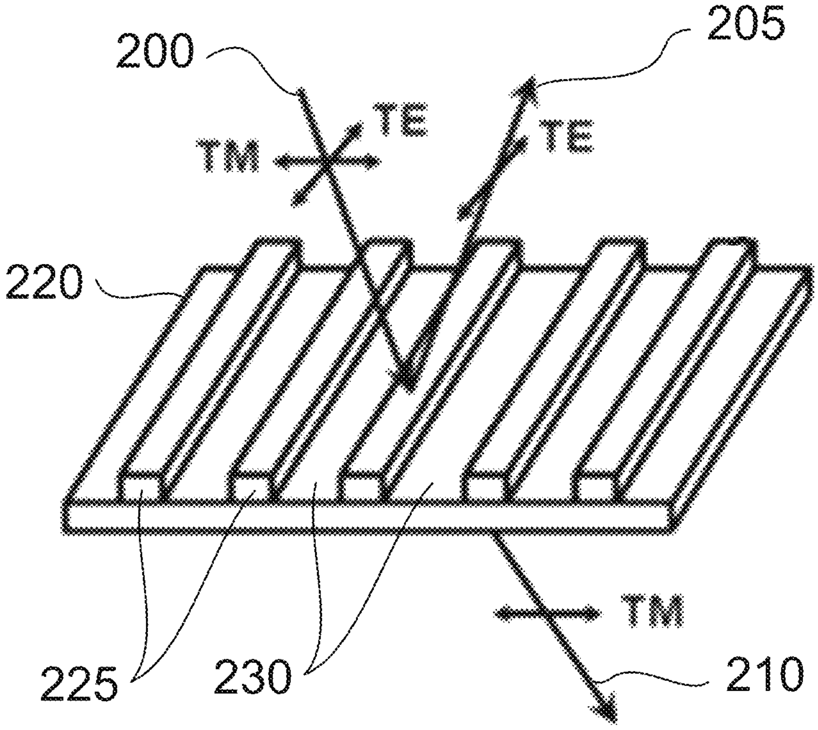
FIG. 2 is a perspective view of a sample illuminated by an incident beam of light.

The line structures can form a grating that functions as an optical polarizer. An example is shown in FIG. 2, which is a perspective view of a sample 220 illuminated by an incident beam 200 of light. The sample 220 can include line structures 225 separated by spaces 230. Depending on the polarization of the incident beam 200 relative to the line structures 225, spectroscopic emissions having different polarization angles are generated. For example, when a polarization angle of the incident beam 200 is parallel to the line structures 225, spectroscopic emissions 205 having a TE polarization are generated, and when a polarization of the incident beam 200 is orthogonal to the line structures 225, spectroscopic emissions 210 having a TM polarization are generated.

Thus, when a sample includes targets each with line structures having different orientations, an incident beam at a fixed polarization generates spectroscopic emissions having different polarization angles. Collecting spectroscopic emissions at different polarization angles can enhance sensitivity and a signal richness associated with the spectroscopic emissions.

Figure 3A:
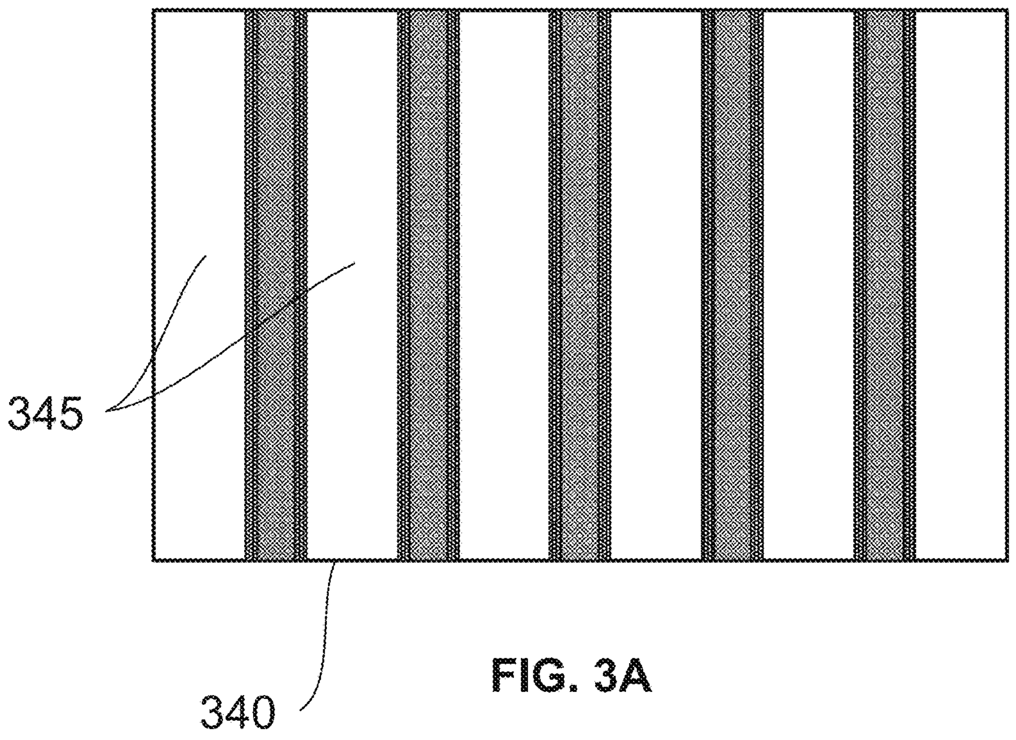
FIGS. 3A-3B are plan views of targets having line structures with different orientations in accordance with an embodiment.
Figure 3B:
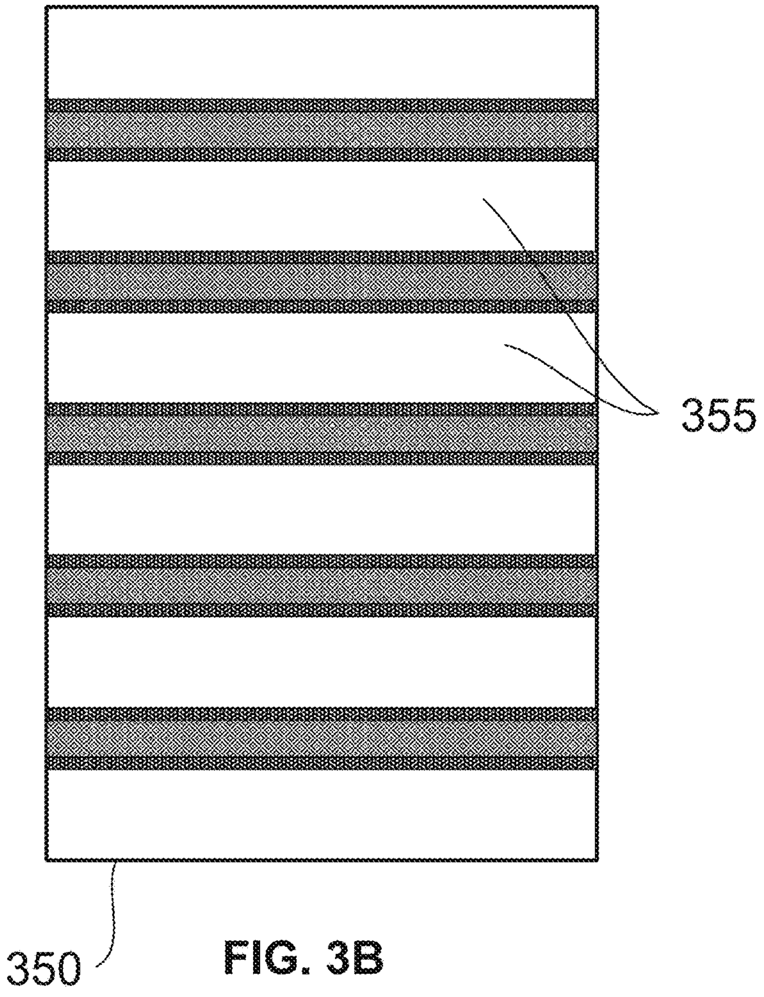

FIGS. 3A-3B are plan views of targets having line structures with different orientations in accordance with an embodiment. FIG. 3A shows a target 340 with vertical line structures 345, and FIG. 3B shows a target 350 with horizontal line structures 355. The line structures 345, 355 may have approximately the same geometry (e.g., based on the same design rules), and the targets 340, 350 may be formed on the same sample. As used herein, a sample may be a semiconductor wafer or any other type of substrate that is used to form electronic devices or miniature structures, and a target may be an area of the sample where structures (e.g., gratings or lines) are formed that may be used for analysis. In some embodiments, the targets 340, 350 may be formed adjacent to each other, within a field of view of the metrology tool, or near enough to each other that processing conditions can be assumed to be about the same. Because the line structures 345, 355 have different orientations, a measurement beam emitted at a fixed polarization will generate spectroscopic emissions having different polarization angles. In this example, the line structures and hence the polarization angle between the targets 340, 350 will the offset by 90°.

Figure 4:
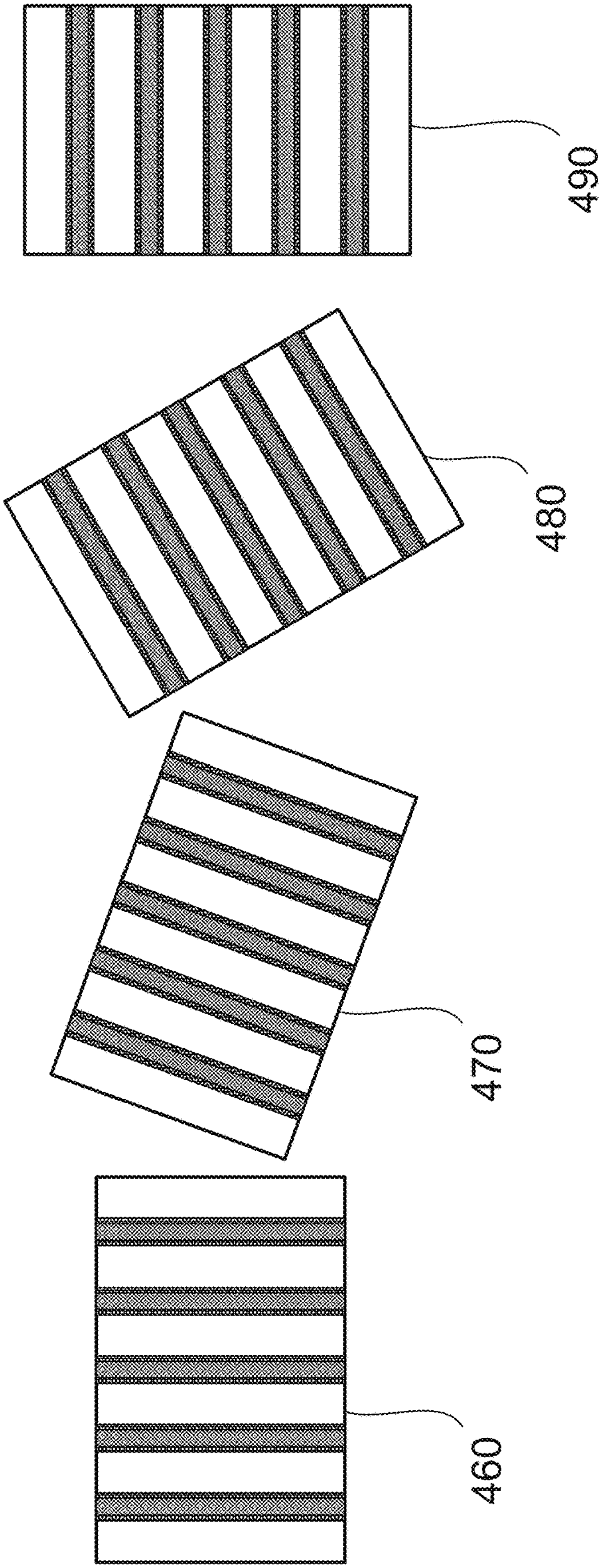
FIG. 4 is a plan view of targets having line structures with different orientations in accordance with an embodiment.

FIG. 4 is a plan view of targets 460, 470, 480, 490 having line structures with different orientations in accordance with an embodiment. The line structures of each target have a different orientation. As with the example shown in FIG. 3, the line structures on the targets 460, 470, 480, 490 will generate spectroscopic emissions having different polarization angles. Assuming the targets 460, 470, 480, 490 are formed on a sample and used for analysis, the corresponding spectroscopic emissions may provide important information about the line structures and associated processing.

Simultaneous measurement of a line structure having N orientations can provide analysis of polarization angle change (and associated change in geometry) comparable to a measurement of the same structure at N analyzer orientations. Simultaneous, on-tool collection of spectroscopic emissions at different polarization angles can provide rapid in-situ process control and analysis compared to serially collecting data at different polarizer orientations, where each orientation requires polarizer adjustment and settle time. Reliability and cost can also be improved by eliminating moving analyzer components.

As explained above, the beam of light can be substantially normal to surfaces of the plurality of targets or at an angle. Ellipsometry is an example where the beam of light is at an angle. Multiple targets, similar to the example of FIG. 4, can be used in place of the rotating polarizer in these applications.

Figure 5:
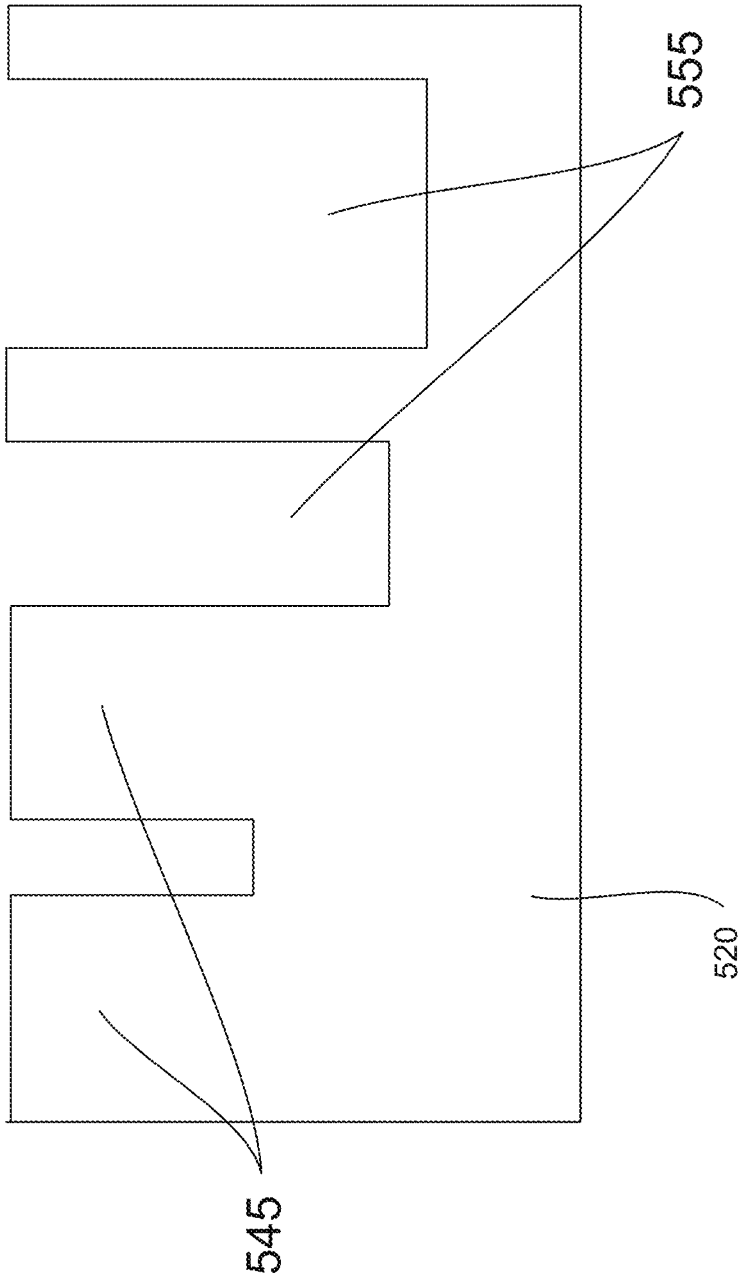
FIG. 5 is a schematic of a cross-sectional view of a sample 520 having different feature geometries according to an embodiment.

In addition to using multiple targets with different orientations, some embodiments may additionally or alternatively use targets having different feature geometries. FIG. 5 is a schematic of a cross-sectional view of a sample 520 having different feature geometries according to an embodiment. The sample 520 can include a plurality of targets with multiple different feature orientations and/or feature geometries. The multiple different feature geometries can include lines 545 and spaces 555 where at least some of the lines and/or spaces have different widths and the spaces have different depths. Features associated with the lines or spaces can include width, depth, sidewall angle, or pitch.

These features can affect process performance. For example, a density of etchant entering a feature geometry and the material byproducts exiting the feature geometry. Geometric dependence on the etchant density and the byproducts can result in pattern-dependent performance of the etch process. Large open areas can, for example, deplete reactive elements in the etch. The depletion of the reactive elements can cause under-etch and variation in sidewall angles. Higher density of smaller features can also deplete reactive elements in the etching process. Higher aspect ratios can also impede transfer of reactive elements and byproducts causing differences in etch depth and geometry. Feature geometries can also impact performance of other processes such as deposition and chemical mechanical planarization (CMP) leading to pattern loading effects. In an embodiment, in-situ imaging metrology can be used to simultaneously measure multiple targets having different feature orientations and/or feature geometries as a fabrication process proceeds. Process parameters (e.g., pressure, flow, radio-frequency) can be optimized and adjusted during the ongoing fabrication process to achieve a particular etch or deposition profile. Multiple wafers can be processed in a feed-forward assembly line scenario with critical dimensions measured and process parameters optimized for a next wafer in the assembly line. A physical model or machine-learning model can be used to establish and optimize a relationship between the process parameters (inputs for the model) and feature orientation and/or geometry (outputs for the model).

Figure 6:
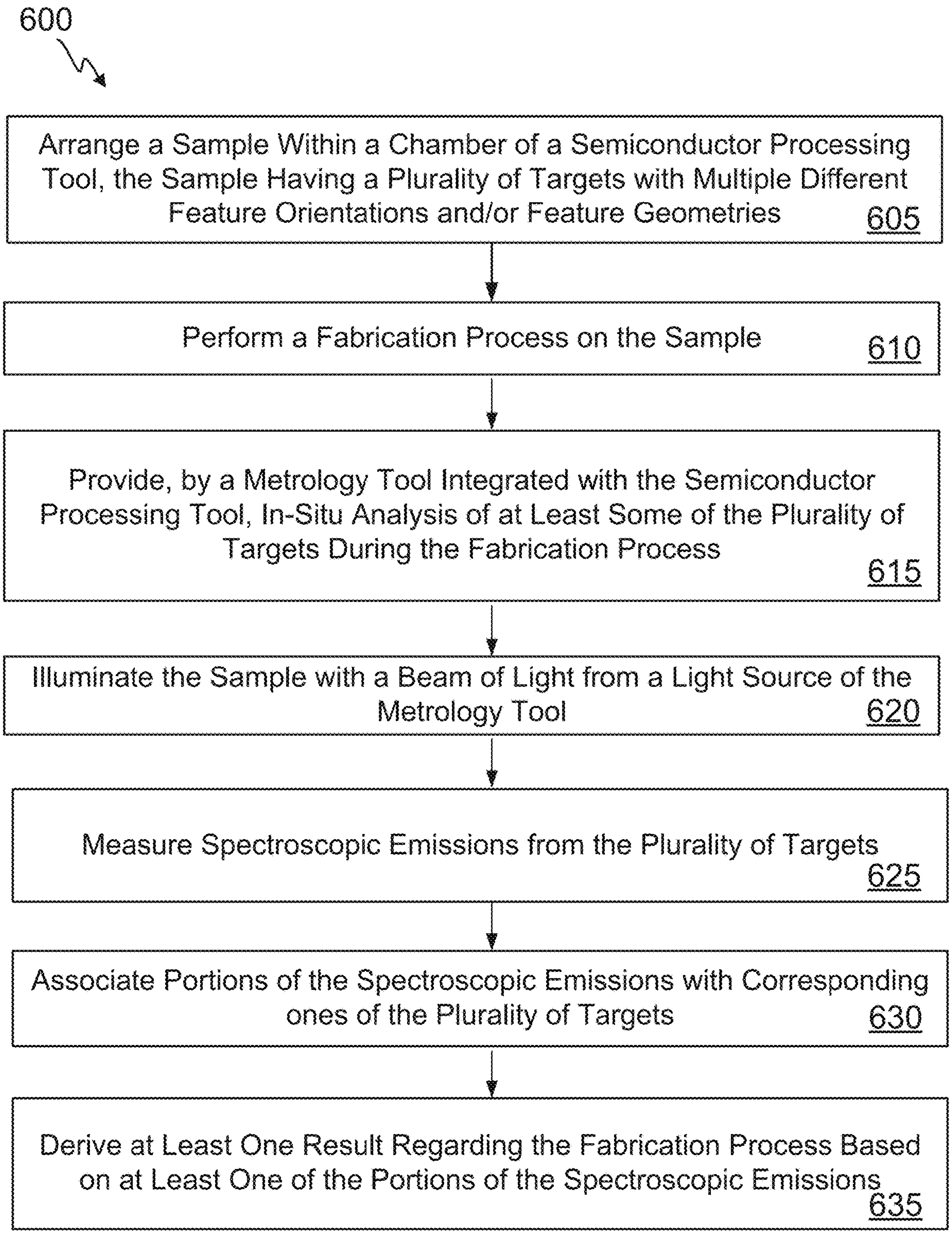
FIG. 6 is a flowchart outlining an exemplary method 600 for providing in-situ analysis of at least some of a plurality of targets on a sample in accordance with an embodiment.

FIG. 6 is a flowchart outlining an exemplary method 600 for providing in-situ analysis of at least some of a plurality of targets on a sample in accordance with an embodiment. At block 605, the method 600 involves arranging a sample within a chamber of a semiconductor process tool, the sample having a plurality of targets with multiple different feature orientations and/or feature geometries. In some examples, the multiple different feature orientations include line or grating structures having different orientations. In some examples, the multiple different feature geometries include lines and spaces where at least some of the lines and/or spaces have different widths. The feature orientations and/or feature geometries can be selected to reveal performance characteristic of a fabrication process.

In an embodiment, at least one of the different feature orientations can be arranged to provide spectroscopic emissions that include TE polarization, and at least another one of the different feature orientations can be arranged to provide spectroscopic emissions that include TM polarization. Additional line/space structures can be printed at different orientation angles to provide additional polarization detail. In some examples, the plurality of targets includes pairs of targets with equivalent geometries. A first member of each pair can have a line structure orientation that is orthogonal to a line structure orientation of a second member of each pair.

At block 610, the method 600 involves performing the fabrication process on the sample. The fabrication process can include, for example, an etch process or a deposition process. The fabrication process can include at least one process parameter. The at least one process parameter can include, for example, a pressure, a flow, or a radio frequency of an electromagnetic field used during the fabrication process.

At block 615, the method 600 involves providing, by a metrology tool integrated with the semiconductor processing tool, in-situ analysis of at least some of the plurality of targets during the fabrication process. The in-situ analysis may be performed simultaneously in some embodiments. In some examples, the metrology tool includes an imaging device that can obtain spectroscopic images of the plurality of targets. The metrology tool can include a light source, an optical system configured to control polarization of a beam of light from the light source, and a detector that can measure spectroscopic emissions from the plurality of targets. The metrology tool and/or the semiconductor processing tool can also include one or more processors and a memory that includes instructions executable by the one or more processors.

At block 620, the method 600 involves illuminating the sample with the beam of light from the light source of the metrology tool. In some examples, the beam of light can be substantially normal to surfaces of the plurality of targets. In other examples, the beam of light can be off-axis to surfaces of the plurality of targets. The metrology tool can be a reflectometer, an ellipsometer, or any other tool that analyzes spectroscopic emissions from a sample.

At block 625, the method 600 involves measuring the spectroscopic emissions from the plurality of targets. In some examples, the detector can measure the spectroscopic emissions from the plurality of targets. The spectroscopic emissions can be measured while the fabrication process is ongoing. In some examples, the spectroscopic emissions can be measured from multiple targets simultaneously. Simultaneous measurement of targets having N different feature orientations can provide analysis of polarization change (and associated change in geometry) comparable to a measurement of the same structure at N analyzer orientations. In other examples, the metrology tool can perform a line scan and measure the spectroscopic emissions from the plurality of targets. The detector can be communicatively coupled to a computing device, and data from the spectroscopic emissions can be received by the computing device. The computing device may be part of the semiconductor processing tool, the metrology tool, or a standalone device that is communicatively coupled with the semiconductor processing tool and/or the metrology tool.

At block 630, the method 600 involves associating portions of the spectroscopic emissions with corresponding ones of the plurality of targets. Associating portions of the spectroscopic emissions can be performed by one or more processors of the computing device. For example, the targets having different feature orientations may provide different spectroscopic emissions. An origin of the spectroscopic emissions on the surface of the sample can be consistent with coordinates on the surface associated with at least one target of the plurality of targets. The coordinates can help locate the targets on the surface of the sample.

At block 635, the method 600 involves deriving at least one result regarding the fabrication process based on at least one of the portions of the spectroscopic emissions. In some examples, the multiple different feature geometries of the plurality of targets include lines structures having different orientations, and the at least one result can include a width, depth, sidewall angle, or pitch associated with at least one of the line structures. In other examples, the multiple different feature geometries of the plurality of targets include lines and spaces where at least some of the lines and/or spaces have different widths and/or depths. The at least one result can include a width, depth, sidewall angle, or pitch associated with at least one of the lines and/or spaces.

The method 600 can further include adjusting at least one process parameter of the fabrication process based at least in part on the at least one result. The at least one process parameter can include pressure, flow, or a radio frequency of an electromagnetic field used during the fabrication process. In some examples, the one or more processors of the computing device 130 can train a machine-learning model to identify at least one result in a future fabrication process using the at least one result.

It should be appreciated that the specific steps illustrated in FIG. 6 provide a particular method for providing in-situ analysis of at least some of a plurality of targets on a sample in accordance with an embodiment. Other sequences of steps may also be performed according to alternative embodiments. For example, alternative embodiments may perform the steps outlined above in a different order. Moreover, the individual steps illustrated in FIG. 6 may include multiple sub-steps that may be performed in various sequences. Furthermore, additional steps may be added or removed depending on the particular application.

Figure 7:
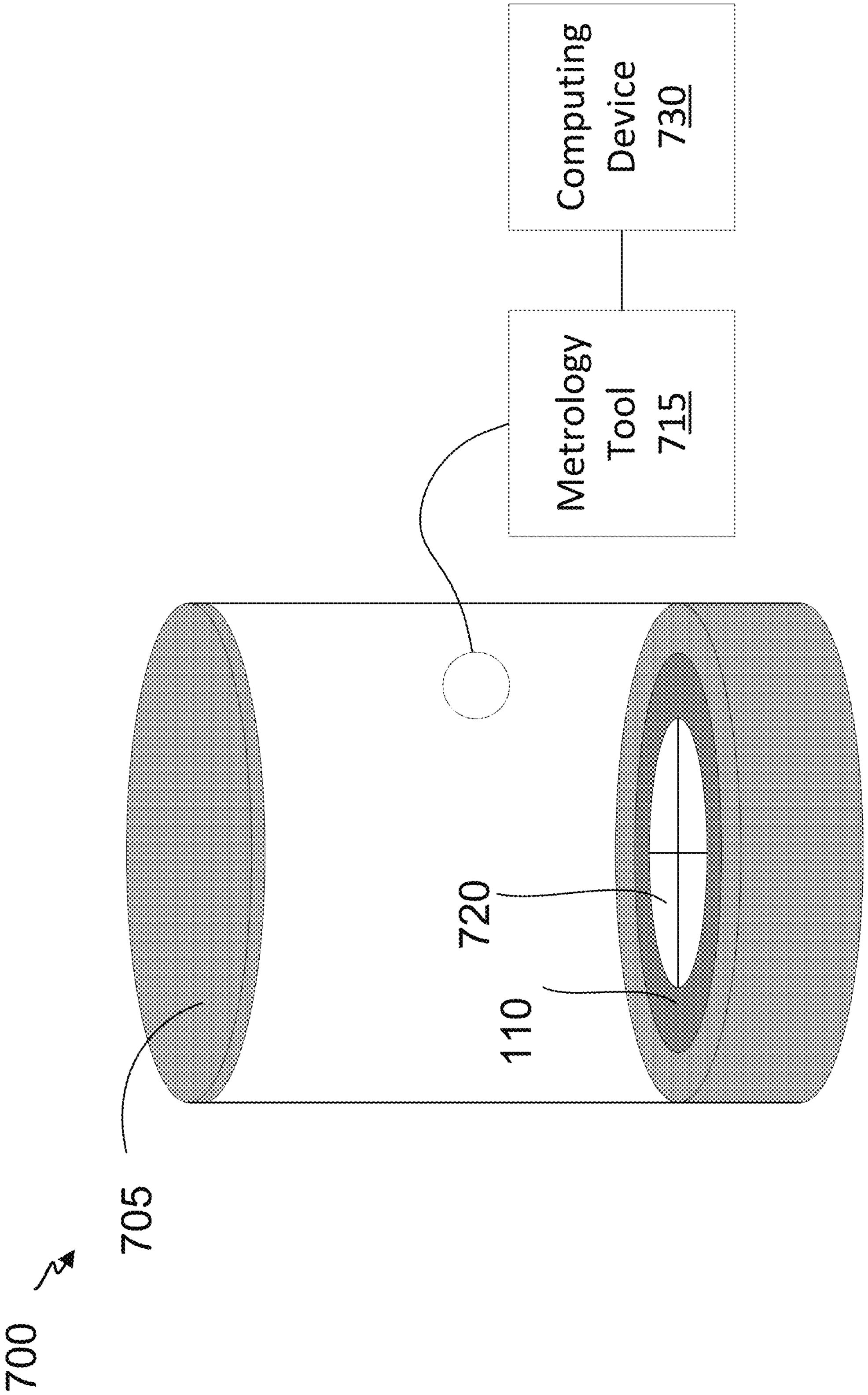
FIG. 7 is a schematic of an environment 700 for providing in-situ analysis of a sample having a plurality of targets according to an embodiment.

FIG. 7 is a schematic of an environment 700 for providing in-situ analysis of a sample having a plurality of targets according to one example of the present disclosure. The environment 700 can include a semiconductor processing tool having a chamber 705, a metrology tool 715, and a computing device 730. The semiconductor processing chamber 705 can include a sample stage 710 configured to support a sample 720 having a plurality of targets.

The sample 720 can be arranged on the sample stage 710 of the semiconductor processing chamber 705 where the fabrication process can be performed on the sample 720. The metrology tool 715 can be integrated with the semiconductor processing chamber 705 and communicatively coupled to the computing device 730. In some examples, the computing device 730 is integrated with the metrology tool 715. The metrology tool 715 can provide in-situ analysis of at least some of the plurality of targets of the sample 720 during the fabrication process.

Figure 8:
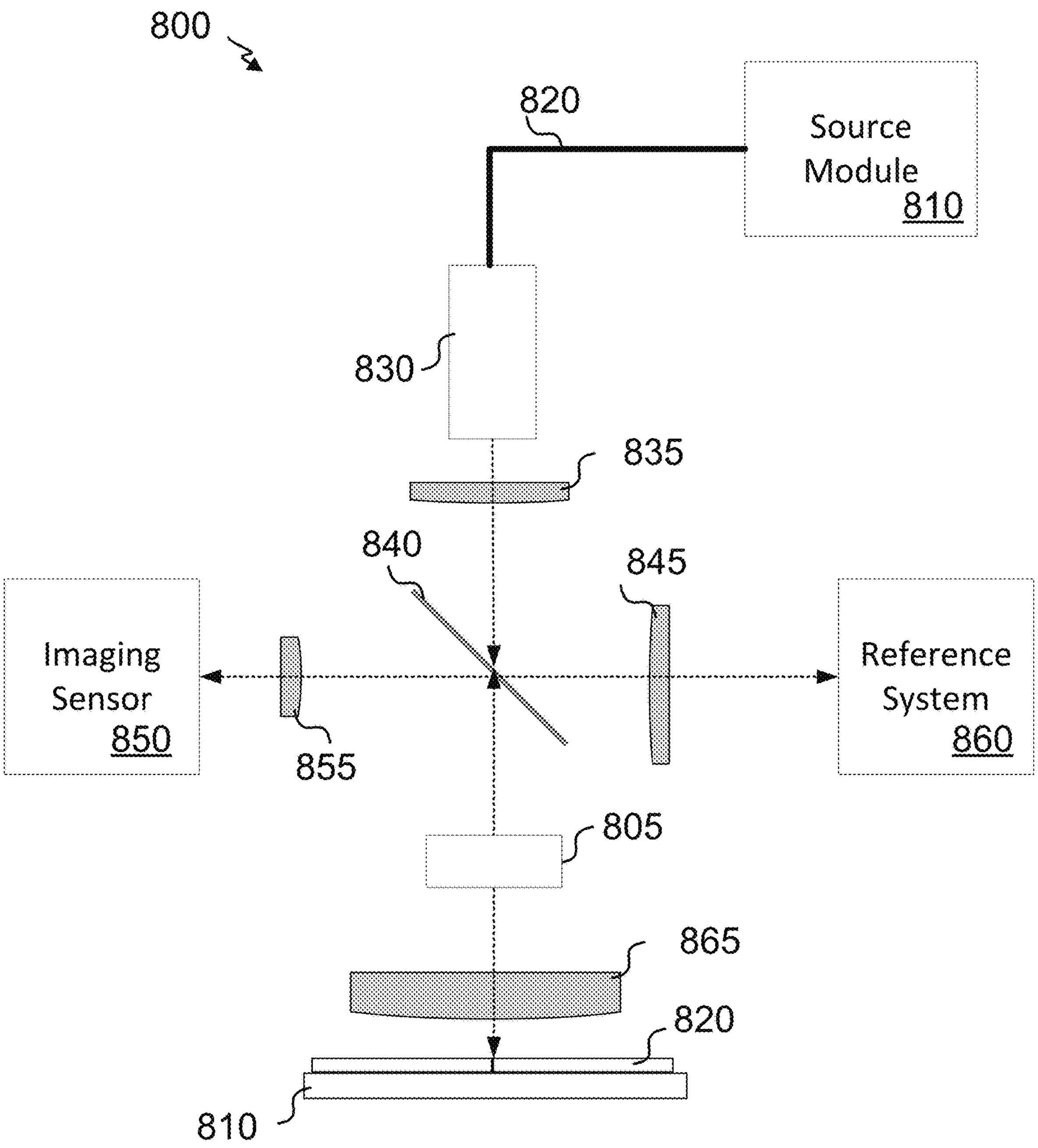
FIG. 8 is a simplified diagram of an exemplary metrology tool 800 that is configured to analyze a sample 820 having a plurality of targets according to an embodiment.

FIG. 8 is a simplified diagram of an exemplary metrology tool 800 that is configured to analyze a sample 820 that may have a plurality of targets according to one example of the present application. As explained with regard to FIG. 7, the metrology tool 800 may be integrated with a processing chamber. In some examples, the metrology tool 800 is an imaging reflectometer. In this example, light from a source module 810 is relayed through a light guide 820 to a homogenizer 808. The light from the homogenizer 808 is directed toward a beam splitter 840. A portion of the light is reflected by the beam splitter 840 toward a reference system 860 and a portion of the light passes through the beam splitter 840 and continues along an optical path toward the sample 820.

In this example, the portion of the light that passes through the beam splitter 840 passes through a polarizer 805 and is imaged by a large field lens 865 onto the sample 820. The large field lens 865 can be composed of a single lens or include a plurality of lenses. Light reflected from the sample 820 is directed through at least a portion of the large field lens 865 and reflected by the beam splitter 840 toward one or more detectors 850. The plurality of targets of the sample 820 can provide spectroscopic emissions when illuminated by light and the light reflected from the sample 820 can include the spectroscopic emissions.

The imaging device 800 may include a number of other lenses (e.g., 835, 845, 855) that shape and/or direct the light along optical paths to the sample 820, to the reference system 860, and to direct the light reflected from the sample 820 to form images on the imaging sensor 850. It should be appreciated that metrology tool in accordance with the embodiments described herein may not include all optical elements shown in FIG. 8 and/or may include other optical elements that are not included in this example. Further, the metrology tool 800 is used merely as an example and other types of metrology tool may be used with the embodiments described herein.

Figure 9:
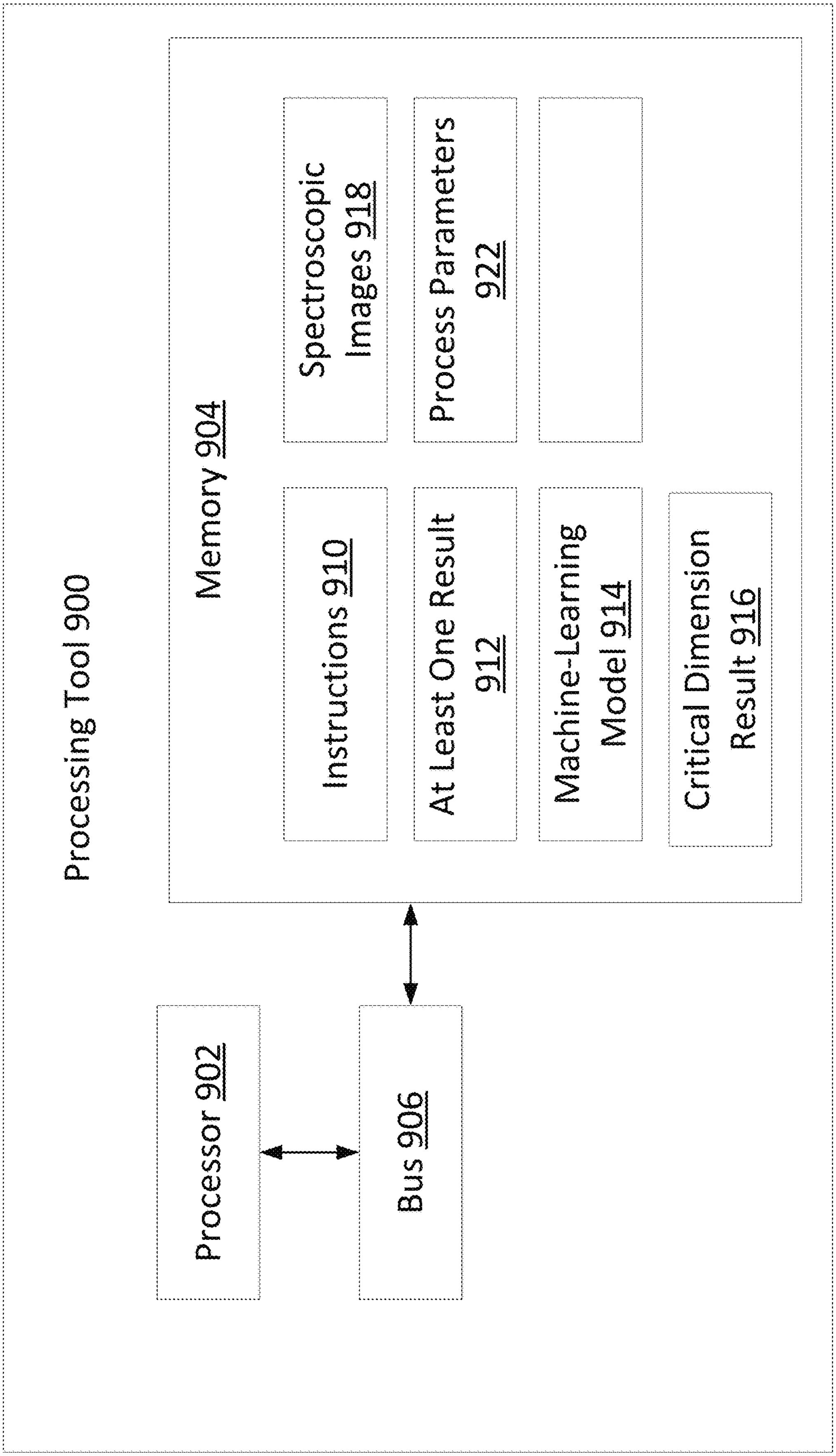
FIG. 9 is a block diagram of an exemplary processing tool 900 for deriving at least one result 912 regarding a fabrication process according to an embodiment.

FIG. 9 is a block diagram of an exemplary processing tool 900 for deriving at least one result 912 regarding a fabrication process according to one example of the present disclosure. The components shown in FIG. 9, such as a processor 902, a memory 904, a bus 906, and the like, may be integrated into a single structure such as within the single housing of the processing tool 900. Alternatively, the components shown in FIG. 9 can be distributed between the processing tool 900, a metrology tool, and/or a computing device.

As shown, the processing tool 900 includes the processor 902 communicatively coupled to the memory 904 by the bus 906. The processor 902 can include one processor or multiple processors. Non-limiting examples of the processor 902 include a Field-Programmable Gate Array (FPGA), an application specific integrated circuit (ASIC), a microprocessor, or any combination of these. The processor 902 can execute instructions 910 stored in the memory 904 to perform operations. In some examples, the instructions 910 can include processor-specific instructions generated by a compiler or an interpreter from code written in any suitable computer-programming language, such as C, C++, C #, or Java.

The memory 904 can include one memory device or multiple memory devices. The memory 904 can be non-volatile and may include any type of memory device that retains stored information when powered off. Non-limiting examples of the memory 904 include electrically erasable and programmable read-only memory (EEPROM), flash memory, or any other type of non-volatile memory. At least some of the memory 904 can include a non-transitory computer-readable medium from which the processor 902 can read instructions 910. The non-transitory computer-readable medium can include electronic, optical, magnetic, or other storage devices capable of providing the processor 902 with the instructions 910 or other program code. Non-limiting examples of the non-transitory computer-readable medium include magnetic disk(s), memory chip(s), RAM, an ASIC, or any other medium from which a computer processor can read instructions 910.

The memory 904 can further include spectroscopic images 918, process parameters 922, a machine-learning model 914, a critical dimension result 916, and at least one result 912 regarding the fabrication process. In some examples, the processing tool 900 can receive the spectroscopic images 918 from a detector and the processor 902 can associate portions of the spectroscopic images 918 with corresponding ones of a plurality of targets. The processor 902 can derive the at least one result 912 regarding the fabrication process based on at least one of the portions of the spectroscopic images 918. The processor 902 can adjust at least one of the process parameters 922 based at least in part on the at least one result 912. The process parameters 922 can include pressure, flow, or a radio frequency of an electromagnetic field used during the fabrication process.

In some examples, the processing tool 900 can implement the process shown in FIG. 6 for effectuating some aspects of the present disclosure. Other examples can involve more operations, fewer operations, different operations, or a different order of the operations shown in FIG. 6.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

What is claimed is:

1. A system comprising:
- a semiconductor processing tool;
- a substrate arranged within a chamber of the semiconductor processing tool, the substrate having a plurality of targets on a surface thereof, the plurality of targets having structures with multiple different feature orientations and/or feature geometries, the semiconductor processing tool configured to perform a fabrication process on the substrate, and the plurality of targets used for analysis of the fabrication process; and
- a metrology tool integrated with the semiconductor processing tool, wherein the metrology tool is configured to provide simultaneous in-situ optical analysis of multiple targets of the plurality of targets during the fabrication process by capturing spectroscopic emissions from the multiple targets through a single set of collection optics and associating specific pixels or regions of an imaging sensor with each respective target of the multiple targets based on a spatial distribution of the plurality of targets on the surface of the substrate.

2. The system of claim 1, wherein the fabrication process comprises an etch process or a deposition process.

3. The system of claim 1, wherein:

the multiple different feature orientations of the plurality of targets include anisotropic structures having different orientations; and the metrology tool comprises:

a light source;

an optical system configured to control polarization of a beam of light from the light source that impinges on the substrate, wherein the plurality of targets with the multiple different feature orientations provide spectroscopic emissions when illuminated with the beam of light from the light source;

a detector configured to simultaneously measure the spectroscopic emissions from the plurality of targets;

one or more processors; and a memory that includes instructions executable by the one or more processors for causing the one or more processors to:

process data from the associated specific pixels or regions of the imaging sensor to isolate the spectroscopic emissions corresponding to each of the multiple targets; and derive at least one result regarding the fabrication process based on the processed data.

4. The system of claim 3, wherein the optical system includes a polarizer having a fixed orientation, and the polarizer is arranged in-line with the beam of light from the light source, and wherein the beam of light is normal to surfaces of the plurality of targets, and the plurality of targets provide the spectroscopic emissions when illuminated with the beam of light.

5. The system of claim 1, wherein at least one of the multiple different feature orientations is configured to provide spectroscopic emissions that include transverse electric (TE) polarization and at least one of the multiple different feature orientations is configured to provide spectroscopic emissions that include transverse magnetic (TM) polarization.

6. The system of claim 1, wherein the plurality of targets comprise pairs of targets with equivalent geometries, a first member of each pair having an anisotropic structure orientation orthogonal to an anisotropic structure orientation of a second member of each pair.

7. The system of claim 3, wherein the at least one result comprises a change in width, depth, or sidewall angle associated with at least one of the anisotropic structures.

8. The system of claim 3, further comprising instructions executable by the one or more processors for causing the one or more processors to adjust at least one process parameter of the fabrication process based at least in part on the at least one result.

9. The system of claim 3, wherein the beam of light is off-axis to surfaces of the plurality of targets.

10. The system of claim 9, further comprising instructions executable by the one or more processors for causing the one or more processors to adjust at least one process parameter of the fabrication process based at least in part on the at least one result.

11. The system of claim 1, wherein:

multiple different feature geometries of the plurality of targets include lines and spaces where at least some of the lines and/or spaces have different geometrical dimensions; and the metrology tool comprises:

the imaging sensor configured to obtain spectroscopic images of the plurality of multiple targets during the fabrication process;

one or more processors; and a memory that includes instructions executable by the one or more processors for causing the one or more processors to:

utilize the association of the specific pixels or regions of the imaging sensor to identify portions of the spectroscopic images corresponding to each of the multiple targets; and derive at least one result regarding the fabrication process based on at least one of the portions of the spectroscopic images.

12. The system of claim 11, wherein the at least one result comprises a width, depth, sidewall angle, or pitch associated with at least one of the lines and/or spaces.

13. The system of claim 11, further comprising instructions executable by the one or more processors for causing the one or more processors to train a machine-learning model to identify a critical dimension result in a future fabrication process using the at least one result.

14. The system of claim 11, further comprising instructions executable by the one or more processors for causing the one or more processors to adjust at least one process parameter of the fabrication process based at least in part on the at least one result.

15. The system of claim 14, wherein the at least one process parameter comprises pressure, flow, or a radio frequency of an electromagnetic field used during the fabrication process.

16. The system of claim 14, wherein plurality of targets are designed to reveal performance characteristic of the fabrication process.

17. A method comprising:

arranging a substrate within a chamber of a semiconductor processing tool, the substrate having a plurality of targets on a surface thereof, the plurality of targets having structures with multiple different feature orientations and/or feature geometries;

performing a fabrication process on the substrate, the plurality of targets used for analysis of the fabrication process; and providing, by a metrology tool integrated with the semiconductor processing tool, simultaneous optical analysis of multiple targets of the plurality of targets during the fabrication process by capturing spectroscopic emissions from the multiple targets through a single set of collection optics and associating specific pixels or regions of an imaging sensor with each respective target of the multiple targets based on a spatial distribution of the plurality of targets on the surface of the substrate.

18. The method of claim 17, wherein the multiple different feature orientations of the plurality of targets include line structures having different orientations, the method further comprising:

illuminating the substrate with a beam of light from a light source of the metrology tool;

measuring the spectroscopic emissions from the multiple targets;

utilize the association of the specific pixels or regions of the imaging sensor to identify portions of the spectroscopic emissions corresponding to each of the multiple targets; and deriving at least one result regarding the fabrication process based on at least one of the portions of the spectroscopic emissions.

19. The method of claim 18, wherein the beam of light is normal to surfaces of the plurality of targets.

20. The method of claim 18, wherein the beam of light is off-axis to surfaces of the plurality of targets.

* * * * *